(12) United States Patent
Guo et al.

(10) Patent No.: US 7,604,836 B2
(45) Date of Patent: Oct. 20, 2009

(54) RELEASE LAYER AND RESIST MATERIAL FOR MASTER TOOL AND STAMPER TOOL

(75) Inventors: Xing-Cai Guo, Tracy, CA (US); Dan S. Kercher, Santa Cruz, CA (US); Bruno Marchon, Palo Alto, CA (US); Charles M. Mate, San Jose, CA (US); Tsai-Wei Wu, San Jose, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 11/610,294

(22) Filed: Dec. 13, 2006

(65) Prior Publication Data
US 2008/0145525 A1 Jun. 19, 2008

(51) Int. Cl.
*B41L 29/12* (2006.01)
(52) U.S. Cl. .................................. 427/133; 425/175
(58) Field of Classification Search ................. 427/402; 264/1.25, 1.27, 1.36, 1.4, 338
See application file for complete search history.

(56) References Cited

U.S. PATENT DOCUMENTS

| | | | |
|---|---|---|---|
| 3,640,219 A | 2/1972 | Farnham et al. | |
| 4,569,962 A | 2/1986 | Burguette et al. | |
| 4,729,938 A * | 3/1988 | Tajima et al. | 430/270.11 |
| 4,743,300 A | 5/1988 | Brinduse et al. | |
| 5,300,613 A | 4/1994 | Kishita et al. | |
| 5,306,758 A * | 4/1994 | Pellerite | 524/366 |
| 5,342,913 A | 8/1994 | Takago et al. | |
| 5,476,752 A * | 12/1995 | Noguchi et al. | 430/287.1 |
| 5,589,319 A | 12/1996 | Katou et al. | |
| 5,639,820 A | 6/1997 | Kubo et al. | |
| 5,772,905 A | 6/1998 | Chou | |
| 6,309,580 B1 | 10/2001 | Chou | |
| 6,630,287 B2 | 10/2003 | Towata | |
| 6,875,475 B2 * | 4/2005 | Moran et al. | 427/437 |
| 6,897,264 B2 | 5/2005 | Lachowicz et al. | |
| 6,897,267 B2 | 5/2005 | Narang et al. | |
| 6,936,194 B2 * | 8/2005 | Watts | 264/1.25 |
| 7,060,774 B2 | 6/2006 | Sparrowe et al. | |
| 2003/0091926 A1 * | 5/2003 | Shelnut | 430/258 |
| 2003/0180467 A1 | 9/2003 | Malik | |
| 2004/0044122 A1 * | 3/2004 | Boldt | 524/589 |
| 2004/0046271 A1 | 3/2004 | Watts | |
| 2004/0110856 A1 | 6/2004 | Young et al. | |
| 2004/0137734 A1 * | 7/2004 | Chou et al. | 438/689 |

(Continued)

FOREIGN PATENT DOCUMENTS

DE 10030016 1/2002

(Continued)

OTHER PUBLICATIONS

Jason P. Rolland et. al. Angew. Chem. Int. Ed. 43(2004) 5796-5799.*

(Continued)

*Primary Examiner*—Michael Cleveland
*Assistant Examiner*—Tabassom Tadayyon Eslami
(74) *Attorney, Agent, or Firm*—Duft Bornsen & Fishman, LLP

(57) ABSTRACT

Methods of performing nanoimprint lithography are described. For one method, a master tool and a stamper tool are formed to provide nanometer-scale imprinting. A release layer comprised of a perfluoropolyether diacrylate material is formed on the master tool and the stamper tool. The master tool and the stamper tool are used to form patterns in resist material, such as hole or pillar patterns. The resist material as described herein has lower viscosity and lower surface tension than prior resist materials allowing for more uniform replication of the patterns.

10 Claims, 5 Drawing Sheets

U.S. PATENT DOCUMENTS

| | | |
|---|---|---|
| 2004/0202865 A1 | 10/2004 | Homola et al. |
| 2005/0043480 A1 | 2/2005 | Osawa |
| 2005/0084613 A1* | 4/2005 | Wang et al. .................. 427/282 |
| 2006/0240257 A1* | 10/2006 | Schwantes et al. ....... 428/402.2 |
| 2007/0018345 A1* | 1/2007 | Chao et al. ................... 264/1.1 |

FOREIGN PATENT DOCUMENTS

| | | |
|---|---|---|
| JP | 2002283354 | 10/2002 |
| JP | 2002348370 | 12/2002 |
| JP | 2004351693 | 12/2004 |

OTHER PUBLICATIONS

Colburn, M. et al., Step and Flash Imprint Lithography: A New Approach to High-Resolution Patterning, Proc. SPIE 3676(1), pp. 379-389 (1999).

Reuther, Freimut, Advanced Polymers and Resists—A Key to the Development of Nanoimprint Lithography, Journal of Photopolymer Science and Technology, vol. 18, No. 4, pp. 525-530 (2005).

Hiroshima, Hiroshi, Fidelity of Photo-Nanoimprint, Journal of Photopolymer Science and Technology, vol. 18, No. 4, pp. 537-542 (2005).

Colburn, Matthew et al., Characterization and Modeling of Volumetric and Mechanical Properties for Step and Flash Imprint Lithography Photopolymers, J.Vac.Sci.Technol. B 19(6), pp. 2685-2689 (2001).

* cited by examiner

RELEASE LAYER AND RESIST MATERIAL FOR MASTER TOOL AND STAMPER TOOL

BACKGROUND OF THE INVENTION

1. Field of the Invention

The invention is related to the field of nanometer-scale imprinting and, in particular, to an improved release layer for a master tool and a stamper tool used in nanometer-scale imprinting, and an improved resist material used in nanometer-scale imprinting.

2. Statement of the Problem

Magnetic disk drive systems typically include a magnetic disk, a recording head having write and read elements, a suspension arm, and an actuator arm. As the magnetic disk is rotated, air adjacent to the disk surface moves with the disk. This allows the recording head (also referred to as a slider) to fly on an extremely thin cushion of air, generally referred to as an air bearing. When the recording head flies on the air bearing, the actuator arm swings the suspension arm to place the recording head over selected circular tracks on the rotating magnetic disk where signal fields are written to and read by the write and read elements, respectively. The write and read elements are connected to processing circuitry that operates according to a computer program to implement write and read functions.

Disk drive manufacturers strive to increase the recording density of drive systems. One way to increase the recording density is to pattern the surface of the magnetic disk to form discrete data tracks, referred to as discrete track recording (DTR). A magnetic disk utilizing DTR typically includes a series of concentric raised zones, which are referred to herein as pillars, providing a medium for storing data.

DTR magnetic disks are fabricated using nanoimprint lithography (NIL). Nanoimprint lithography is a high-throughput method for imprinting nanometer-scale patterns on a substrate. To imprint the nanometer-scale patterns on a substrate, a master tool is first fabricated having a desired pattern. The master tool is not typically used for imprinting an actual substrate as it can be quickly worn out when a large number of imprints are needed. The master tool is expensive and time consuming to fabricate, so the master tool is rather used to fabricate a plurality of stamper tools. The stamper tools are actually used for imprinting the substrates.

To fabricate a stamper tool, the master tool is pressed into a layer of polymer stamper resist material to imprint the inverse pattern of the master tool in the stamper resist material. Heat or ultraviolet (UV) irradiation may then be applied to the stamper resist material to harden the stamper resist material in the inverse pattern of the master tool. The master tool is then removed from the stamper resist material leaving a stamper tool having a desired pattern. The stamper tool may then be used to imprint a plurality of substrates.

To imprint a substrate, the stamper tool is pressed against a thin layer of replica resist material deposited on the substrate to imprint the inverse pattern of the stamper tool in the replica resist material. The stamper tool is then removed from the replica resist material leaving a substrate with a desired resist pattern covering the substrate. An etching process, such as Reactive Ion Etching (RIE), may then be performed to pattern the substrate according to the resist pattern. A similar process is performed to pattern many substrates using the stamper tool.

When the master tool is pressed into the layer of stamper resist material, some of the resist material may stick to the master tool. Similarly, when the stamper tool is pressed into the layer of replica resist material, some of the resist material may stick to the stamper tool. To avoid such a problem, a release layer is formed on the master tool and the stamper tool from some type of anti-adhesion material. The release layer has anti-adhesion properties (low surface energy and low friction) so that the resist material does not stick to the master tool or the stamper tool when these tools are pulled away from the resist material. One anti-adhesion material commonly used to form release layers is fluoroalkyltrichlorosilane.

One problem with the present anti-adhesion materials is that they do not effectively bond to both the master tool and the stamper tool. For example, a silane-based anti-adhesion material will effectively bond to the silanol groups on a master tool formed from Silicon (Si). However, the silane-based anti-adhesion material will not bond directly to a polymer stamper tool because the polymer material of the stamper tool does not include silanol groups as does the Si material. As a result, the release layer will not effectively adhere to the stamper tool as it does the master tool.

Another problem with present nanometer-scale processes is that the nanometer-scale patterns do not replicate with a desired consistency. For instance, assume that a hole or pillar (hole/pillar) pattern is imprinted by a stamper tool into the replica resist material on a substrate. The replica resist material is typically polymethyl methacrylate (PMMA). When the stamper tool is pulled away from the replica resist material, some of the pillars in the pattern may not be replicated at all and some of the pillars may have a height significantly shorter than desired. It is thus desirable to have substantially uniform pillar heights in a pattern in the resist material indicating that the pattern was accurately replicated.

SUMMARY OF THE SOLUTION

The invention solves the above and other related problems with an anti-adhesion material that effectively adheres to both a master tool and a stamper tool to form a release layer. The anti-adhesion material in one embodiment comprises a perfluoropolyether diacrylate material, although other materials exhibiting similar properties may also be used. The perfluoropolyether diacrylate material effectively bonds to the master tool and the stamper tool upon curing unlike presently-used anti-adhesion materials. For instance, if the master tool is formed from Silicon, then the diacrylate end groups of the anti-adhesion material effectively bond to the Silicon material upon curing. If the stamper tool is formed from a polymer material, then the diacrylate end groups of the anti-adhesion material also effectively bond to the polymer material. The release layer formed from the improved anti-adhesion material as proposed herein advantageously adheres to both the master tool and the stamper tool unlike present release layers. The perfluoropolyether backbone of the release layer also provides effective anti-adhesion properties so that resist material will not stick to the master tool or the stamper tool.

One embodiment comprises a method of performing nanoimprint lithography. The method includes fabricating a master tool with a master pattern. The master pattern is formed on a surface of the master tool. The method further includes forming a release layer on the master pattern of the master tool. The release layer on the master pattern comprises a perfluoropolyether diacrylate. The method further comprises pressing the master tool against stamper resist material on a stamper tool to form a stamper pattern on the stamper tool. Because of the release layer, the stamper resist material does not adhere to the master tool. The method further includes forming a release layer on the stamper pattern of the stamper tool. As with the master tool, the release layer on the stamper pattern comprises a perfluoropolyether diacrylate.

The stamper tool may then be used to pattern a plurality of substrates for the nanoimprint process.

In another embodiment, the resist material used for nanoimprint lithography is comprised of an acrylate monomer (a non-PMMA monomer) having a viscosity at or below about 8 cps at 25 degrees Celsius. The acrylate monomer also has a surface tension at or below about 32 dynes/cm. This type of resist material advantageously allows for more uniform replication of a pattern from a master tool or a stamper tool, especially for hole or pillar patterns.

Other exemplary embodiments described herein provide alternative methods of performing nanoimprint lithography, which are described in more detail below.

DESCRIPTION OF THE DRAWINGS

The same reference number represents the same element or same type of element on all drawings.

DETAILED DESCRIPTION OF THE INVENTION

Figure 1:
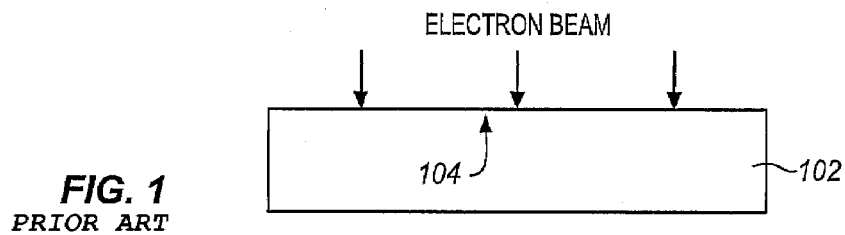
FIGS. 1-9 illustrate a typical nanoimprint process in the prior art.
Figure 2:
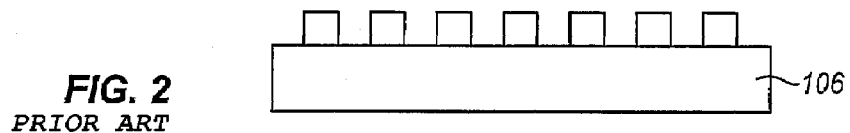
Figure 3:

FIGS. 1-9 illustrate a typical nanoimprint process in the prior art. First, electron beam lithography is used to fabricate a master tool out of a Silicon (Si) wafer 102 as illustrated in FIG. 1. The electron beam lithography fabricates a master pattern on a surface 104 of Si wafer 102, which results in a master tool 106 as illustrated in FIG. 2. A release layer 108 is then formed on the master pattern of master tool 106 as illustrated in FIG. 3. The release layer 108 is typically formed by dipping master tool 106 in an anti-adhesion material, and then curing the anti-adhesion material through exposure to ultraviolet irradiation or heat.

Figure 4:
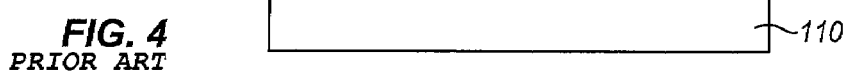
Figure 5:

Master tool 106 is then used to form one or more stamper tools. As shown in FIG. 4, a stamper tool initially includes a stamper body 110 with stamper resist material 112 deposited on a surface of stamper body 110. Master tool 106 is then pressed against the stamper resist material 112 to imprint the inverse of the master pattern in the stamper resist material 112. Heat or UV irradiation may then be applied to the stamper resist material 112 to harden the stamper resist material 112 in the inverse pattern of master tool 106. Master tool 106 is then pulled away from the stamper resist material 112 leaving a stamper tool 114 having a desired stamper pattern as illustrated in FIG. 5. The stamper pattern in stamper tool 114 is the inverse of the master pattern in master tool 106. The release layer 108 that is formed on master tool 106 (see FIG. 4) has properties such that the stamper resist material 112 does not adhere to master tool 106 when master tool 106 is pulled away from the stamper resist material 112.

Figure 6:
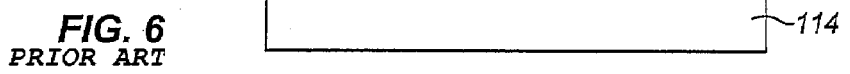
Figure 7:
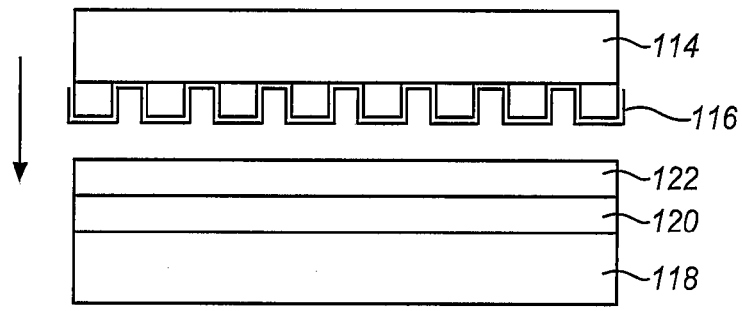
Figure 8:
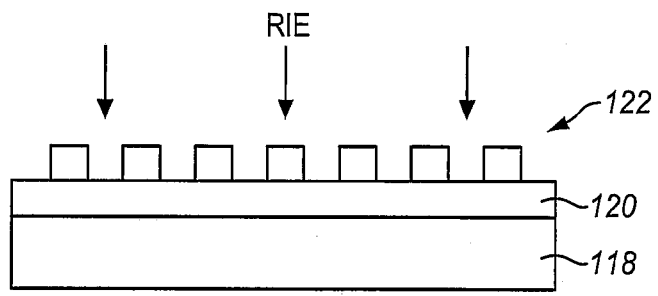

Stamper tool 114 may then be used to imprint a plurality of substrates. A release layer 116 is formed on the stamper pattern of stamper tool 114 as illustrated in FIG. 6. The release layer 116 is typically formed by dipping stamper tool 114 in an anti-adhesion material. As with master tool 106, the anti-adhesion material is then cured onto stamper tool 114 through exposure to ultraviolet irradiation or heat. As illustrated in FIG. 7, a substrate 118 to be imprinted includes an overcoat layer 120, such as $Si_3N_4$, with replica resist material 122 deposited on the overcoat layer 120. Stamper tool 114 is then pressed against the replica resist material 122 to imprint the inverse of the stamper pattern in the replica resist material 122. Stamper tool 114 is then removed from the replica resist material 122 leaving a desired substrate pattern in the replica resist material as shown in FIG. 8. The release layer 116 that is formed on stamper tool 114 (see FIG. 7) has properties such that the stamper resist material 122 does not adhere to stamper tool 114 when stamper tool 114 is pulled away from the replica resist material 122.

Figure 9:
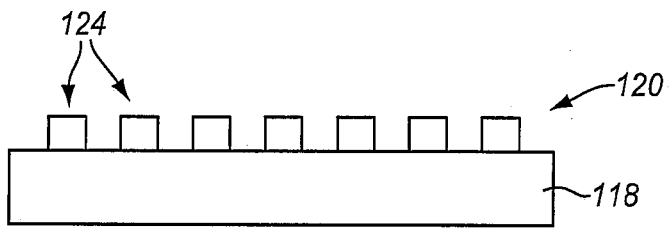

An etching process (e.g., Reactive Ion Etching (RIE)) may then be performed to pattern the overcoat layer 120 and the substrate 118 as is illustrated in FIG. 9. The final pattern on substrate 118 may include a plurality of pillars 124. The goal of the nanoimprint process is to create uniform pillars 124 at the nanometer scale. As discussed in the Background, there are some problems with present nanoimprint processes. First, the release layers presently used do not effectively adhere to the master tool and the stamper tool. Secondly, the resist material presently used does not allow for uniform replication of hole/pillar patterns as desired.

FIGS. 10-13 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Figure 10:
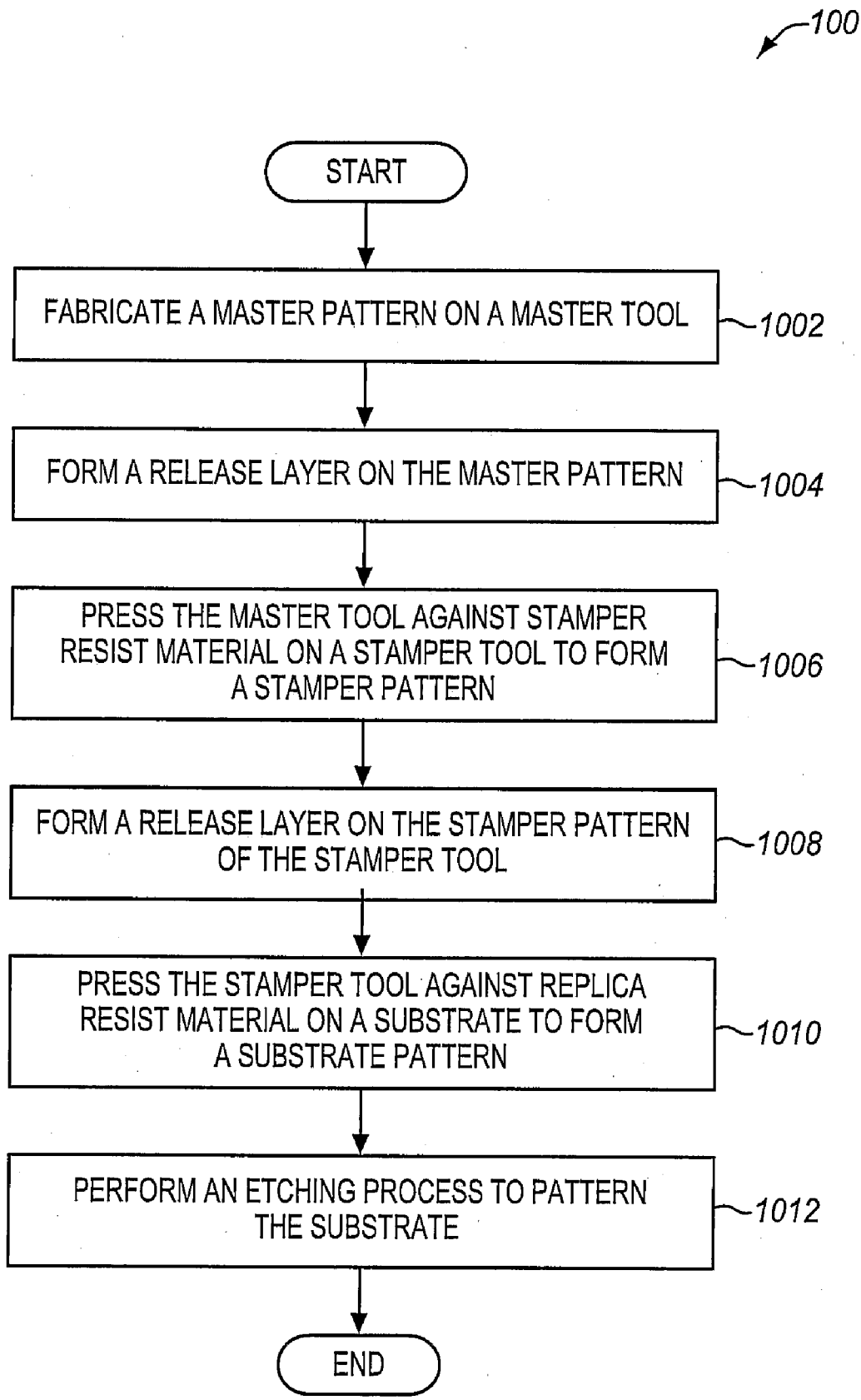
FIG. 10 is a flow chart illustrating a method of performing nanoimprint lithography in an exemplary embodiment of the invention.

FIG. 10 is a flow chart illustrating a method 1000 of performing nanoimprint lithography in an exemplary embodiment of the invention. The steps of method 1000 may relate to the process described in FIGS. 1-9, so a reference back to FIGS. 1-9 is provided where appropriate.

In step 1002, a master tool is fabricated with a master pattern (see also FIG. 2). A master tool comprises any tool, form, or template used to imprint one or more stamper tools. A master pattern comprises any pattern, such as a hole/pillar pattern, that is formed or fabricated on a master tool. The master pattern is fabricated in the nanometer scale to provide for nanoimprinting. If a hole/pillar pattern is used, then the density of the pattern is equal to or greater than about 300 $Gbits/in^2$.

Figure 11:
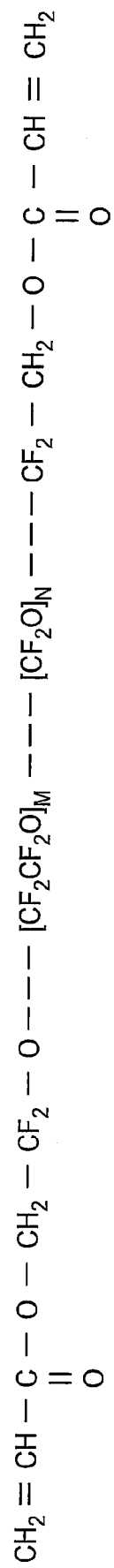
FIG. 11 illustrates the molecular structure of perfluoropolyether diacrylate.

In step 1004, a release layer is formed on the master pattern of the master tool (see also FIG. 3) with an anti-adhesion material. A release layer comprises any material or coating having anti-adhesion properties. In an improvement over prior nanoimprint processes, the release layer for the master tool in this embodiment is comprised of a perfluoropolyether diacrylate material. FIG. 11 illustrates the molecular structure of perfluoropolyether diacrylate. In this embodiment, the molecular weight of the perfluoropolyether diacrylate may be in the range of 500 to 10,000. The m/n ratio (see FIG. 11) of the perfluoropolyether diacrylate may be in the range of 0.5 to 2 depending on the desired flexibility of the material. The anti-adhesion material of the release layer may alternatively be referred to as a perfluoro polymer, a fluorinated molecule with diacrylate end groups, a perfluoropolyether with diacrylate end groups, etc.

In step 1006 of FIG. 10, the master tool is then pressed against stamper resist material on a stamper tool to form a corresponding stamper pattern on the stamper tool (see also FIGS. 4-5). A stamper tool comprises any tool, form, or template used to imprint one or more substrates. A stamper pattern comprises any pattern, such as a hole/pillar pattern, that is formed or fabricated on a stamper tool. The stamper resist material comprises a soft or pliable material used to take the shape of the master pattern of the master tool. The stamper resist material is then heated or otherwise treated to permanently take the shape of the master pattern. The master tool is then pulled away from the stamper tool leaving the stamper pattern.

In step 1008, a release layer is formed on the stamper pattern of the stamper tool with an anti-adhesion material (see also FIG. 6). The release layer for the stamper tool is also comprised of a perfluoropolyether diacrylate material. Once formed, the stamper tool may be used to repeatedly replicate the stamper pattern on substrates.

In step 1010, the stamper tool is then pressed against replica resist material on a substrate to form a corresponding substrate pattern in the substrate resist material (see also FIGS. 7-8). A substrate comprises any wafer or material that is to be imprinted, such as a magnetic disk for magnetic storage. Replica resist material comprises a pliable or soft material used to take the shape of the stamper pattern of the stamper tool to provide a mask for an etching process. In step 1012, an etching process is then performed to pattern the substrate (see also FIG. 9). The desired pattern on the substrate may be a hole/pillar pattern or another type of pattern desired in nanometer-scale processes.

The perfluoropolyether diacrylate material of the release layer as described herein effectively adheres to both the master tool and the stamper tool in an improvement in the art. If the master tool is fabricated from a Silicon (Si) wafer, then the diacrylate end groups of the release layer effectively bond to the Si material upon curing. If the stamper tool is fabricated from a polymer material, then the diacrylate end groups of the release layer also effectively bond to the polymer material upon curing. The perfluoropolyether backbone of the release layer also provides effective anti-adhesion properties so that resist material (the stamper resist material or the replica resist material) will not stick to the master tool or the stamper tool.

The following briefly describes one example of how to apply a perfluoropolyether diacrylate material to the master tool and the stamper tool, although other applications may be used. The perfluoropolyether diacrylate material in this example is Fomblin Z perfluoropolyether with diacrylate end groups (Z-DA). To start, 18 drops of Z-DA are dissolved in 250 ml of nonafluo(iso)butyl methyl ether (HFE-7100). After surface cleaning of the master tool or the stamper tool with decafluoropentane (Vertrel XF), the master tool or the stamper tool is dipped into and drawn from the Z-DA solution at a constant speed of 5 mm/s between which is 5 seconds of soaking. This coats a uniform layer of Z-DA at a thickness of 1.4 nm. The coated Z-DA is then cured by ultraviolet (UV) light at a wavelength of 185 nm for 3 minutes under a nitrogen purge. The cured Z-DA is 100% bonded to the master tool or the stamper tool at this point and cannot be removed with a rinsing solution (e.g., Vertrel XF) commonly used to clean the master tool and the stamper tool after an imprint.

To solve the problem of poor replication of the nanometer-scale patterns, an improved resist material is used in the imprint process. In one embodiment of the invention, the resist material is comprised of an acrylate monomer (a non-PMMA monomer) having a viscosity at or below about 8 cps at 25 degrees Celsius. The acrylate monomer also has a surface tension at or below about 32 dynes/cm. Further characteristics of the acrylate monomer are increased UV curability and mechanical strength.

Figure 12:
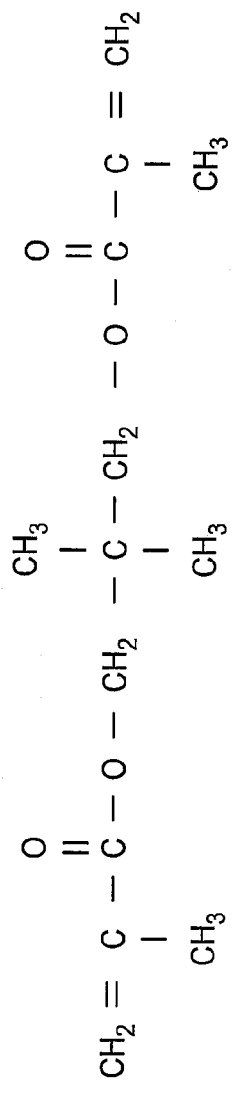
FIG. 12 illustrates the molecular structure of neopentyl glycol dimethacrylate.

One exemplary acrylate monomer exhibiting these characteristics is illustrated in FIG. 12. FIG. 12 illustrates the molecular structure of neopentyl glycol dimethacrylate. Other exemplary acrylate monomers exhibiting similar characteristics are trimethylpropane triacrylate, propoxylated glyceryl triacrylate, isobornyl methacrylate, and octyldecyl acrylate.

For method 1000 described in FIG. 10, the stamper resist material may comprise the acrylate monomer having the characteristics described above. Similarly, the replica resist material may comprise the acrylate monomer having the characteristics described above. These resist materials may be used in processes utilizing the improved anti-adhesion material described above, or may be used in processes that are not utilizing the improved anti-adhesion material.

Figure 13:
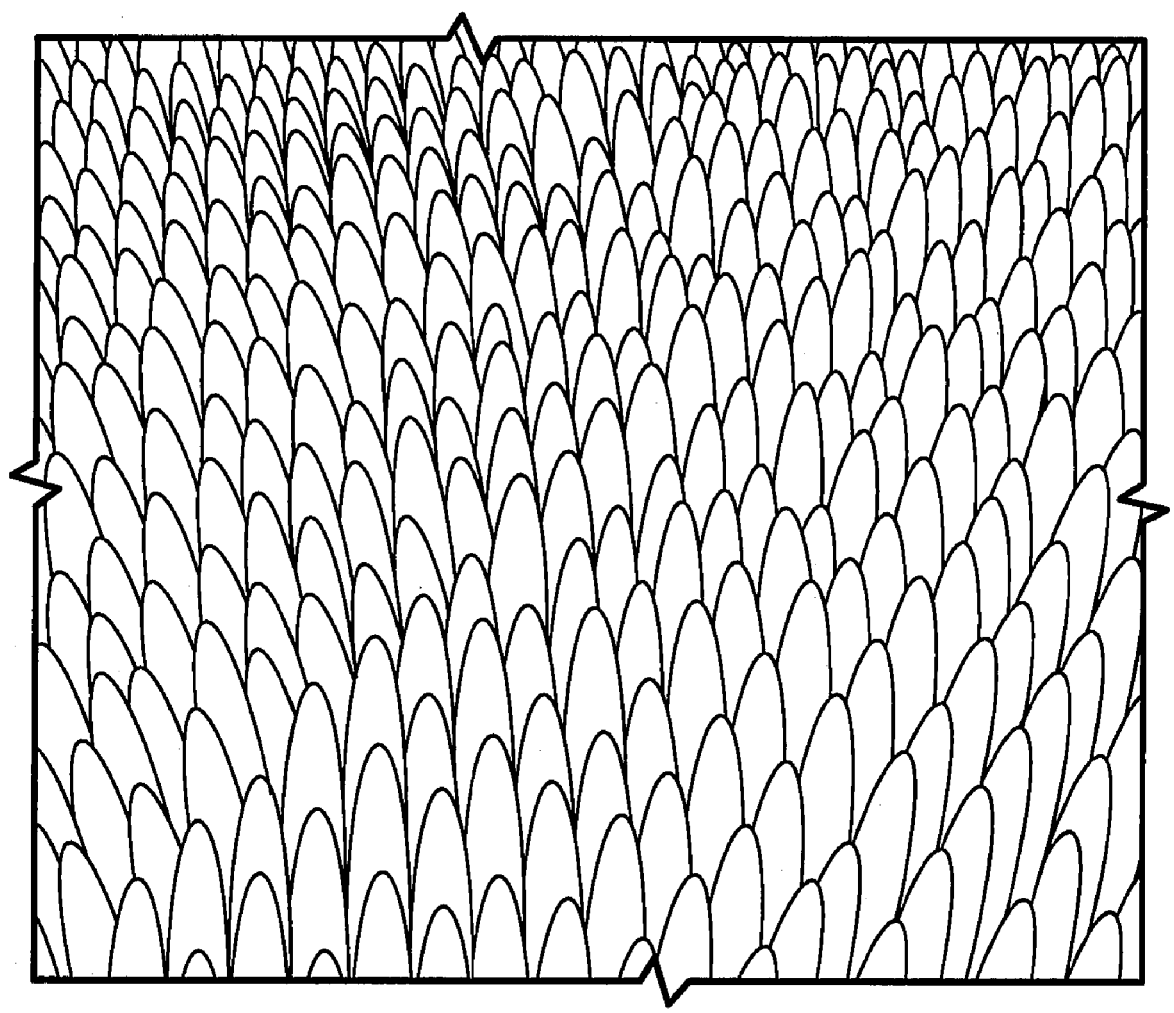
FIG. 13 is an isometric view of a pillar pattern formed in resist material.

When using the improved resist material, the nanometer-scale patterns on the master tool and the stamper tool may be more uniformly replicated in the resist material. Because of the characteristics of lower viscosity and lower surface tension, as compared to PMMA, a hole/pillar pattern may be more accurately replicated in the resist material. Upon curing, the resist material also has a higher mechanical strength meaning that the pillars of the pattern are less likely to break when the master or stamper tool is pulled away from the resist material. FIG. 13 is an isometric view of a pillar pattern formed in the resist material. In the pattern shown in FIG. 13, the pillars are uniformly replicated having substantially similar heights and shapes. The pattern in FIG. 13 corresponds to 300 Gbits/in$^2$ and the mean pillar height is about 53.5 nanometers with a standard deviation of about 4.7 nanometers.

The accurate pattern replication provided by the improved resist material is especially evident in nanometer-scale hole or pillar patterns as compared to linear line patterns. Nanoimprinting may be used to imprint linear line patterns, such as for traces on a printed circuit board. These linear line patterns are more easily imprinted because the resist material can easily flow in the grooves of the linear line pattern and eventually take the shape of the pattern. With a hole or pillar pattern, the resist material does not flow along linear lines or grooves, but rather has to flow between and around many pillars in the pattern. The lower viscosity of the resist material allows the resist material to more easily flow along the shape of the hole or pillar pattern allowing for uniform replication of the pattern.

The improved resist material also advantageously allows for high RIE selectivity. RIE selectivity is a ratio of the rate at which an overcoat material etches compared to the rate at which a resist material etches. To achieve taller pillars or deeper holes in a hole/pillar pattern, it is desirable to have the resist material etch slower than the overcoat material. The improved resist materials as described herein, such as neopentyl glycol dimethacrylate, etch slower than an overcoat material to provide a desired RIE selectivity. For example, a $Si_3N_4$ overcoat etches at a rate of about 0.49 nm/s, and the improved resist materials described herein etch at a rate of about 0.19 nm/s. The RIE selectivity provided by the resist materials are thus about 2.5, which is an improvement over presently-used resist materials.

Although specific embodiments were described herein, the scope of the invention is not limited to those specific embodiments. The scope of the invention is defined by the following claims and any equivalents thereof.

We claim;
1. A method of performing an imprint process, the method comprising:
   fabricating a master tool with a master pattern;
   forming a release layer on the master pattern of the master tool, wherein the release layer on the master pattern comprises a perfluoropolyether diacrylate having a molecular weight between about 1500-2500 atomic mass units;
   pressing the master tool against stamper resist material on a stamper tool to form a stamper pattern on the stamper tool, wherein the stamper resist material is formed from neopentyl glycol dimethacrylate; and
   forming a release layer on the stamper pattern, wherein the release layer on the stamper pattern comprises a perfluoropolyether diacrylate having a molecular weight between about 1500-2500 atomic mass units.

2. The method of claim 1 wherein forming a release layer comprises:
   dipping the master tool in the perfluoropolyether diacrylate material; and
   curing the perfluoropolyether diacrylate material on the master tool.

3. The method of claim 2 wherein curing the perfluoropolyether diacrylate material comprises:
   exposing the perfluoropolyether diacrylate material to ultraviolet irradiation.

4. The method of claim 2 wherein curing the perfluoropolyether diacrylate material comprises:
   exposing the perfluoropolyether diacrylate material to heat.

5. The method of claim 1 wherein the stamper resist material is comprised of a material having a viscosity below about 8 cps at 25 degrees Celsius and a surface tension below about 32 dynes/cm.

6. A method of performing nanoimprint lithography, the method comprising:
   fabricating a nanometer-scale hole/pillar pattern on a surface of a master tool;
   forming a release layer on the surface of the master tool, wherein the release layer on the master tool comprises a perfluoro polymer having a molecular weight between about 1500-2500 atomic mass units;
   pressing the master tool against stamper resist material on a stamper tool to pattern a corresponding hole/pillar pattern in the stamper resist material of the stamper tool, wherein the stamper resist material is formed from neopentyl glycol dimethacrylate;
   forming a release layer on the stamper tool, wherein the release layer on the stamper tool comprises a perfluoro polymer having a molecular weight between about 1500-2500 atomic mass units;
   pressing the stamper tool against replica resist material on a substrate to pattern a corresponding hole/pillar pattern in the replica resist material; and
   performing an etching process to pattern the substrate.

7. The method of claim 6 wherein forming a release layer comprises:
   dipping the master tool in the perfluoro polymer material; and
   curing the perfluoro polymer material on the master tool.

8. The method of claim 7 wherein curing the perfluoro polymer material comprises:
   exposing the perfluoro polymer material to ultraviolet irradiation.

9. The method of claim 7 wherein curing the perfluoro polymer material comprises:
   exposing the perfluoro polymer material to heat.

10. A method of performing nanoimprint lithography, the method comprising:
    fabricating a master pattern on a Silicon (Si) master tool;
    forming an anti-adhesion layer on the Si master tool, wherein the anti-adhesion layer on the Si master tool comprises a perfluoropolyether with diacrylate end groups having a molecular weight between about 1500-2500 atomic mass units, and wherein the diacrylate end groups bond to the Si master tool upon curing;
    pressing the Si master tool against a polymer stamper resist material on a stamper tool to pattern the polymer stamper resist material, wherein the stamper resist material is formed from neopentyl glycol dimethacrylate;
    forming an anti-adhesion layer on the polymer stamper tool, wherein the anti-adhesion layer on the polymer stamper tool comprises a perfluoropolyether with diacrylate end groups having a molecular weight between about 1500-2500 atomic mass units, and wherein the diacrylate end groups bond to the polymer stamper tool upon curing;
    pressing the polymer stamper tool against replica resist material on a substrate to pattern the replica resist material; and
    performing an etching process to pattern the substrate.

* * * * *